(12) United States Patent
Rieubon et al.

(10) Patent No.: US 7,466,789 B2
(45) Date of Patent: Dec. 16, 2008

(54) COUNTER WITH CORRECTION CIRCUITRY

(75) Inventors: Sébastien Rieubon, Saint Jean de Moirans (FR); Michael Kraemer, Lans en Vercors (FR)

(73) Assignee: STMicroelectronics S.A., Montrouge (FR)

( * ) Notice: Subject to any disclaimer, the term of this patent is extended or adjusted under 35 U.S.C. 154(b) by 68 days.

(21) Appl. No.: 11/724,517

(22) Filed: Mar. 15, 2007

(65) Prior Publication Data

US 2007/0216556 A1  Sep. 20, 2007

(30) Foreign Application Priority Data

Mar. 15, 2006  (FR)  ................... 06 50872

(51) Int. Cl.
*H03K 25/00* (2006.01)
*H03K 9/06* (2006.01)
*H03D 3/00* (2006.01)

(52) U.S. Cl. .............. 377/94; 327/48; 327/49

(58) Field of Classification Search ............. 327/47–49; 377/94, 118, 119
See application file for complete search history.

(56) References Cited

U.S. PATENT DOCUMENTS

| | | | | |
|---|---|---|---|---|
| 4,882,740 A | * | 11/1989 | Abe et al. ............. | 377/49 |
| 5,056,123 A | * | 10/1991 | Rashid ................ | 377/49 |
| 5,440,252 A | * | 8/1995 | Lee ................... | 327/47 |
| 5,896,049 A | * | 4/1999 | Saunders et al. ...... | 327/48 |
| 6,861,881 B1 | | 3/2005 | Neravetla et al. | |
| 2003/0117181 A1 | * | 6/2003 | Powell et al. ......... | 327/48 |
| 2004/0008060 A1 | | 1/2004 | Watanabe | |

FOREIGN PATENT DOCUMENTS

JP  11355110 A  12/1999

* cited by examiner

*Primary Examiner*—Tuan T Lam
(74) *Attorney, Agent, or Firm*—Lisa K. Jorgenson; James H. Morris; Wolf, Greenfield & Sacks, P.C.

(57) ABSTRACT

The invention concerns counting circuitry for providing a corrected count value based on the number of rising and falling edges of an input signal occurring during a reference time period, the counting circuitry comprising a counter (22) arranged to provide a first count value based on one of the number of said rising edges of said input signal occurring during said reference time period, and the number of said falling edges of said input signal occurring during said reference time period; characterized in that said counting circuitry further comprises adjustment circuitry (24-26) arranged to generate a corrected count value by determining the state of said input signal at the start time (70) and end time (72) of said reference time period, and adjusting said first count value if the state of said input signal at the start of said reference time period is different from the state of said input signal at the end of said reference time period.

10 Claims, 3 Drawing Sheets

US 7,466,789 B2

COUNTER WITH CORRECTION CIRCUITRY

BACKGROUND OF THE INVENTION

1. Field of the Invention

The present invention relates to a counter for counting periods of an input signal during a reference period. In particular, the present invention relates to a counter comprising additional circuitry for correcting a count value to provide improved precision.

2. Discussion of the Related Art

In order to measure the frequency of an input oscillating signal, for example the square-wave output of a voltage controlled oscillator (VCO), a counter can be used. During a known reference time period, generally provided by a high quality quartz oscillator that generates clean timing edges, a counter counts the number of periods of the input oscillating signal. The frequency f can then be determined as:

$$f = \text{count}/t_{REF}$$

where "count" is the count value reached by the counter during the reference period and $t_{REF}$ is the duration of the reference time period.

Counters are limited, however, in that they generally count either the rising or falling edges of an input signal, and when the start and end times of the reference period are not close to the relevant edge of the input signal, the count value will be inaccurate. There is thus an inherent inaccuracy in the count value which can be as high as nearly two counts of the counter. The frequency f of the input signal is thus:

$$f = (\text{count} + \epsilon)/t_{REF}$$

where $\epsilon$ is the count error with $0 < \epsilon < 2$.

One way of reducing the effect of this error is to increase the reference time period so that the count is higher and the error $\epsilon$ becomes less significant. However according to this solution the time needed to calculate the input frequency is increased, and this is not compatible for applications in which a result from the counter is required quickly.

FIG. 1 illustrates a known method of increasing the accuracy of the counter without increasing the reference time period. Such a method is described, for example, in "A digitally controlled PLL for SoC applications", T. Olsson and P. Nilsson, IEEE Solid-State Circuits, vol. 39, no. 5, pp. 751-760, May 2004.

As shown in FIG. 1, a circuit comprises two counters, a first counter 2 which counts rising edges of an input signal, and a second counter 4 which counts the falling edges of the input signal. The input signal is provided to each counter on an input line 6. The first and second counters 2, 4 are controlled to count the rising and falling edges respectively of the input signal during the reference time period. The output of each counter is provided to an adder 8 which adds the counts together to provide a combined count value on output line 10, which represents the number of half periods of the input signal. The error $\epsilon$ is therefore halved, and the frequency can be determined as:

$$f = 0.5(\text{combined count} + \epsilon)/t_{REF}$$

One disadvantage of the circuit of FIG. 1 is that two counters are required instead of one. In practice, to achieve a sufficiently accurate frequency estimation, thousands of periods of the input signal are counted, and therefore the counters are for example 12-bit or 15-bit counters, which require a relatively significant chip area. There is thus a need for a counter that provides improved accuracy over the single counter solution described above, without requiring a second counter and without increasing the reference time period.

SUMMARY OF THE INVENTION

Embodiments of the present invention aim to at least partially address the above-mentioned needs.

According to one aspect of the present invention, there is provided counting circuitry for providing a corrected count value based on the number of rising and falling edges of an input signal occurring during a reference time period, the counting circuitry comprising a counter arranged to provide a first count value based on the number of rising or falling edges of said input signal occurring during said reference time period; wherein said counting circuitry further comprises adjustment circuitry arranged to generate a corrected count value by determining the state of said input signal at the start time and end time of said reference time period, and adjusting said first count value if the state of said input signal at the start of said reference time period is different from the state of said input signal at the end of said reference time period.

The adjustment circuitry may be arranged to add a value to said first count value when said input signal is at a first state at said start time and at a second state at said end time, and to subtract a value when said input signal is at said second state at said start time and at said first state at said end time.

The adjustment circuitry may be comprised multiplying means arranged to multiply said first count value by two, and adding means arranged to selectively add one and selectively subtract one from the result of said multiplication to generate said corrected count value.

The counter may be arranged to count the falling edges of said input signal during said reference time period, and said adjustment circuitry is arranged to add one to the result of said multiplication when said input signal is low at said start time and high at said end time, and minus one from the result of said multiplication when said input signal is high at said start time and low at said end time.

The counter may be arranged to count the rising edges of said input signal during said reference time period, and said adjustment means is arranged to add one to the result of said multiplication when said input signal is high at said start time and low at said end time, and minus one from the result of said multiplication when said input signal is low at said start time and high at said end time.

The start and end times of said reference time period may be determined by edges of a reference time signal, and the adjustment circuitry preferably comprises first sampling means arranged to sample said reference time signal with falling edges of said input signal and output the result, second sampling means arranged to sample said reference time signal with rising edges of said input signal and output the result, and third sampling means arranged to sample the output of one of said first and second sampling means with the rising and falling edges of the output of the other one of said first and second sampling means, the generation of said corrected count value being based on the output of said third sampling means.

According to a further aspect of the present invention, there is provided a calibration circuit for calibrating a voltage controlled oscillator, the voltage controlled oscillator generating an output oscillating signal, said calibration circuit comprising a frequency detector as described above for providing a count value based on the number of rising and falling edges of said output signal of said voltage controlled oscillator and comparing means for comparing said count value with a reference value and calibrating said voltage controlled oscillator based on said comparison.

The voltage controlled oscillator is preferably calibrated by shifting its operating range.

According to a further aspect of the present invention, a mobile device is provided comprising counting circuitry according to any of the embodiments described above.

According to a further aspect of the present invention there is provided a method of providing a count value based on the number of rising and falling edges of an input signal occurring during a reference time period, the method comprising providing a first count value based on counting the number of rising or falling edges of said input signal occurring during said reference time period; determining the state of said input signal at the start time and end time of the reference time period, adjusting said first count value if the state of said input signal at the start of said reference time period is different from the state of said input signal at the end of said reference time period to generate a corrected count value, and outputting the corrected count value.

BRIEF DESCRIPTION OF THE DRAWINGS

The foregoing and other purposes, features, aspects and advantages of the invention will become apparent from the following detailed description of a number of embodiments which is given by way of illustration only without limiting the invention, and throughout which reference is made to the accompanying drawings in which.

DETAILED DESCRIPTION

Figure 1:
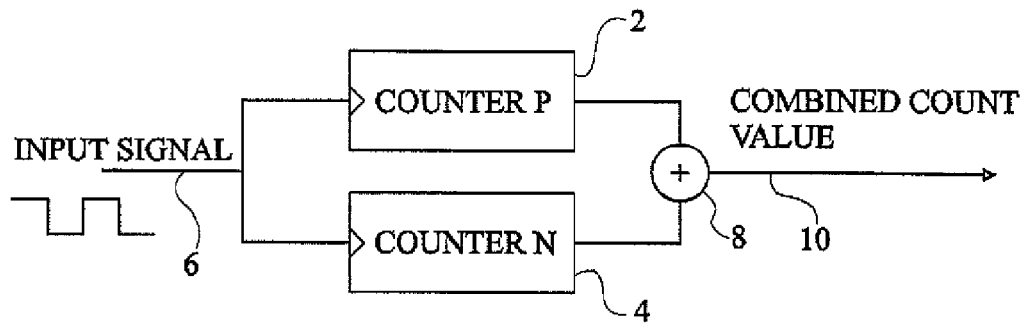
FIG. 1 (already described above) illustrates a known counting circuit having two counters.
Figure 2:
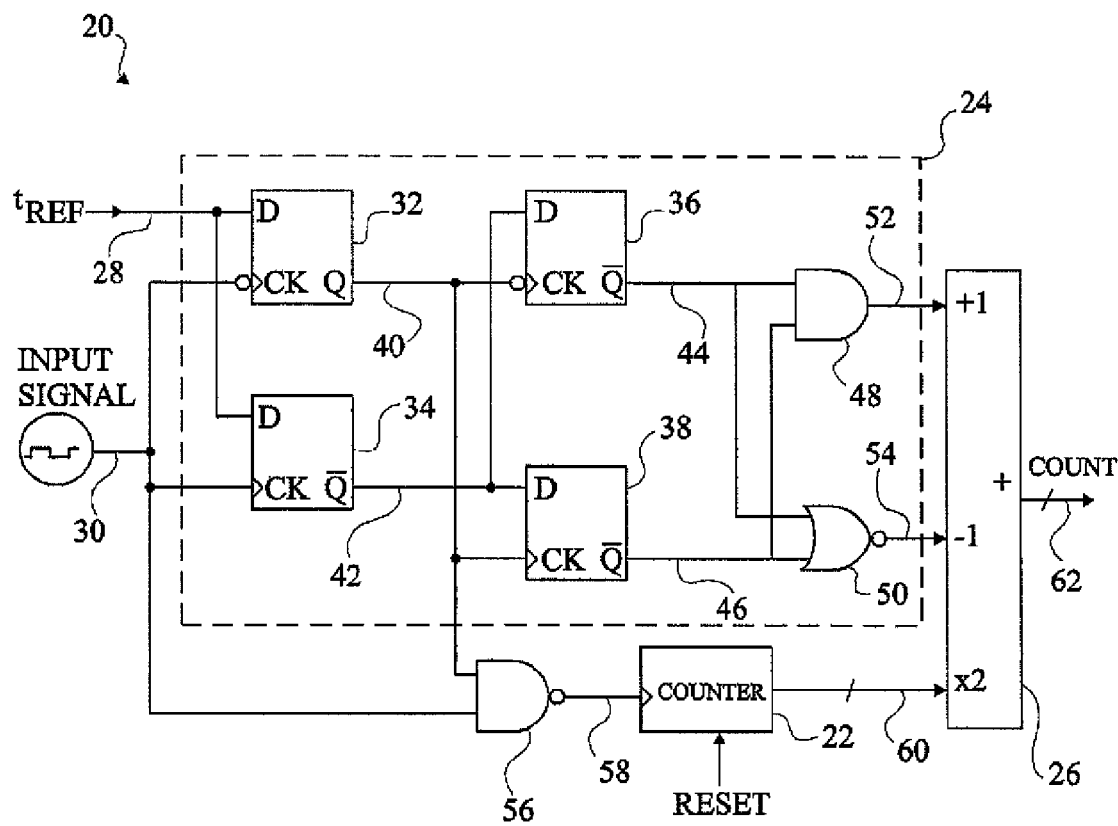
FIG. 2 illustrates a counting circuit according to one embodiment of the present invention.

FIG. 2 illustrates a counting circuit 20 according to one embodiment. This circuit allows the number of timing edges of an input signal during a reference time period $t_{REF}$ to be determined, and can be used for determining, for example, the frequency of the output of a voltage controlled oscillator (VCO).

The counting circuit 20 comprises a counter 22 having a reset input for resetting the count value of the counter. The counter is, for example, a 12-bit or 15-bit counter. The circuit further comprises adjustment circuitry 24 for detecting whether the count value from the counter should be adjusted. The outputs from the counter 22 and the adjustment circuitry 24 are provided to an adder block 26.

The adjustment circuitry 24 receives a reference signal, $t_{REF}$, on line 28, which represents a reference time period, and is preferably a clean signal generated by a quartz oscillator. The adjustment circuitry 24 also receives an input signal on line 30.

The adjustment circuitry comprises first, second, third and fourth D-type flip-flops labeled 32, 34, 36 and 38 respectively, a two-input AND gate 48 and a two-input NOR gate 50. The signal $t_{REF}$ is provided on line 28 to the data input of each of the first and second flip-flop 32, 34. The input signal is provided on line 30 to the clock input of each of the first and second flip-flops, however it is inverted at the clock input of the first flip-flop 32, but not at the input of the second.

The Q output of the first flip-flop 32 is connected to the clock inputs of the third and fourth flip-flops 36, 38, however it is inverted at the clock input of the third flip-flop but not at the input of the fourth. The inverse Q output of the second flip-flop 34 on line 42 is provided to the data input of the third and fourth flip-flops 36, 38. It is reminded that the Q output of a D-type flip-flop takes the value of the data input shortly after the significant edge (rising or falling) of the signal at its clock input.

The inverse Q outputs from the third and fourth flip-flops on lines 44 and 46 respectively are each connected to one input of the AND gate 48 and one input of the NOR gate 50. The outputs of AND gate 48 on line 52 and of NOR gate 50 on line 54 are provided to an adder block 26, and in particular line 52 is connected to a '+1' input of the adder block 26, whilst line 54 is connected to a '−1' input of the adder block.

Counter 22 receives a signal on line 58 from a two-input NAND gate 56. The first and second inputs of the NAND gate 56 are connected to the input signal on line 30 and to the Q output of the first flip-flop 32 on line 40 respectively. Counter 22 counts the rising edges of the signal on line 58 and provides the result on line 60 to the adder block 26, and in particular to a 'x2' input of the adder block.

Adder block 26 provides an output count value on line 62, which comprises x+1 bits, where x is the number of bits of the counter. The output count value is determined as the count value on line 60 multiplied by two, and with one added or subtracted based on the signals on lines 52 and 54 respectively.

Operation of the counting circuit 20 of FIG. 2 will now be described with reference to the timing diagrams of FIGS. 3A to 3D.

Each FIG. 3A to 3D illustrates signals at various points in the circuit of FIG. 2. In particular, each figure illustrates, with a corresponding reference numeral, the input signal on line 30, the reference timing signal $t_{REF}$ on line 28, the Q output of the first flip-flop on line 40, the inverse Q output of the second flip-flop on line 42, the inverse Q output of the third flip-flop on line 44, the inverse Q output of the fourth flip-flop on line 46, the output from AND gate 48 on line 52, the output from NOR gate 50 on line 54, the output from NAND gate 56 on line 58, the reset input to counter 22 and the count value on line 60.

Figure 3A:
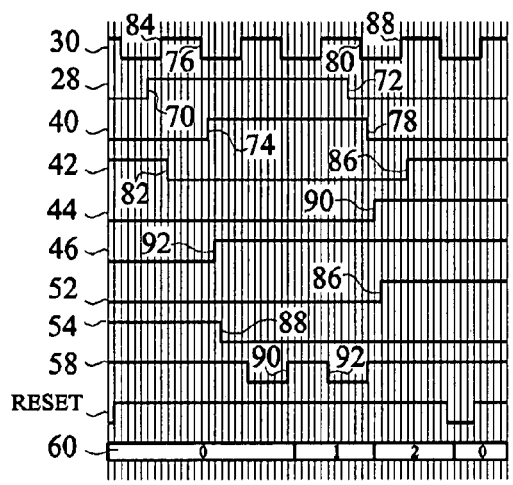
FIGS. 3A to 3D show timing diagrams for different states of the circuit of FIG. 2.

With reference to FIG. 3A, the reference time signal on line 28 comprises a rising edge 70 indicating the start of the reference time period $t_{REF}$ and a falling edge 72 indicating the end of this period. In this example rising edge 70 occurs during a low half-period of the input signal on line 30, whilst falling edge 72 occurs during a high half-period of the input signal. Signal $t_{REF}$ is sampled at the first flip-flop by the falling edges of the input signal, and as shown the signal on line 40 goes high (edge 74) shortly after the falling edge 76 of input signal, and low (edge 78) shortly after the falling edge 80 of the input signal. Signal $t_{REF}$ is also sampled at the second flip-flop 34, but by the rising edges of the input signal. The signal on line 42, which is the inverse Q output, goes low (edge 82) shortly after the rising edge 84 of input signal, and high (edge 86) shortly after the rising edge 88 of the input signal.

Next, at the third flip-flop 36, the inverse of the signal on line 40 is used to clock the output on line 42 of the second flip-flop, and as shown, the output signal on line 44, which is the inverse Q output, goes high (edge 90) shortly after the falling edge 78. This signal on line 44 indicates the state of the input signal at the end time (edge 72) of the reference time period, and therefore goes high indicating that the input signal was high.

At the fourth flip-flop 38, the signal on line 40 is used to clock the output on line 42 of the second flip-flop, and as shown, the output signal on line 46, which is the inverse Q output, goes high (edge 92) shortly after the falling edge 74. This signal on line 46 indicates the inverse of the state of the input signal at the start time (edge 70) of the reference time period, and therefore goes high indicating that the input signal was low.

The signals on lines 44 and 46 are provided to AND gate 48 and NOR gate 50, which generate the signals indicating whether the count value should be adjusted by adding 1, subtracting 1, or if it should remain unchanged by doing neither. As shown in FIG. 3A, the signal on line 52 to the '+1' input of adder 26 is high, whilst the signal on line 54 to the '−1' input of the adder is low.

The signal on line 58 is used to clock counter 22 during the reference time period. To ensure a clean signal to the counter, the signal on line 40 and the input signal on line 30 are connected to NAND gate 56 to generate the signal on line 58 that controls the counter 22. The two rising edges 90, 92 of this signal increment the count, which is shown rising from 0 to 2 on line 60. Line 60 and the output on the adder block on line 62 in fact comprise multiple data paths in parallel. In the present example the counter 22 is a 12-bit counter, and this line 60 comprises 12 parallel data paths, whilst line 62 comprises 13 parallel data paths.

Due to the use of NAND gate 56, the count value relates to falling edges of the input signal. This count value is multiplied by two by the adder block 26, by shifting the binary signal one bit to the left, and adding a zero. For example, the binary count value "10" (2) becomes "100" (4). This provides an approximate value for the number of half periods of the input signal. Adder block 26 then adds one half period if the signal on line 52 is high, and subtracts one half period if the signal on line 54 is high. In the case of FIG. 3A, one half value is added, giving a total count of five, which is output on line 62.

The reset signal resets the counter after the final count has been determined. The reset signal is for example controlled to go low a predetermined time after the end of the reference period (edge 72).

As a general rule, when the state (high or low) of the input signal at the start time of the reference period and at the end time of the reference period are the same, (both high or both low), no adjustment is required. In the embodiment of FIG. 2, in which the count is performed based on falling edges of the input signal, when the input signal is low at the start time and high at the end time of the reference period, one is added to the count value. On the other hand, if the input signal is high at the start time and low at the end time of the reference period, one is subtracted from the count value.

Figure 3B:
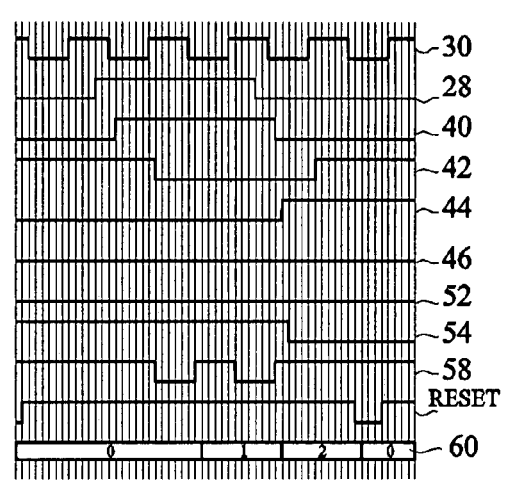
Figure 3C:
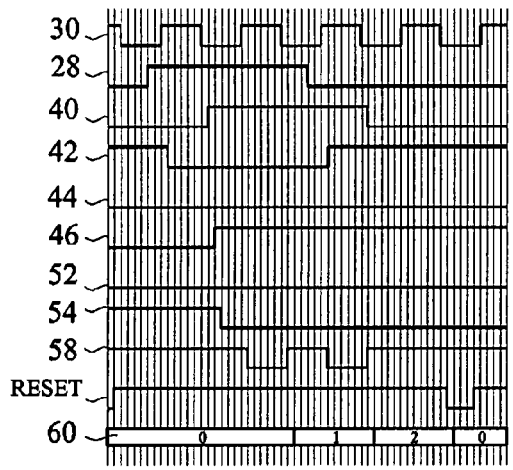

The timing diagrams of FIGS. 3B and 3C illustrates the cases in which the input signal is high or low respectively at both the start time and end time of the reference time period. In these cases nothing is added or subtracted from the count value, as indicated by both signals 52 and 54 being low in both cases. The count value therefore remains at four.

Figure 3D:
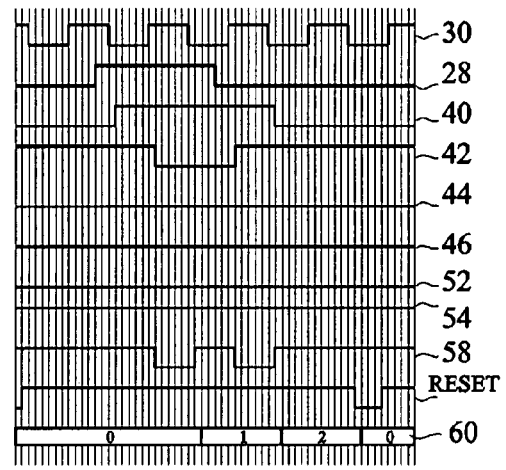

The timing diagram of FIG. 3D illustrates the case in which the input signal is high at the start time and low at the end time of the reference period, and therefore the signal on line 54 is high, indicating that 1 is subtracted from the count value. The count value is therefore determined as 4−1=3.

The count value on line 62 can be provided to a variety of circuitry to perform a variety of functions.

For example, the counter circuitry can be used to calibrate the frequency of a voltage controlled oscillator, as will now be described with reference to FIG. 4.

Figure 4:
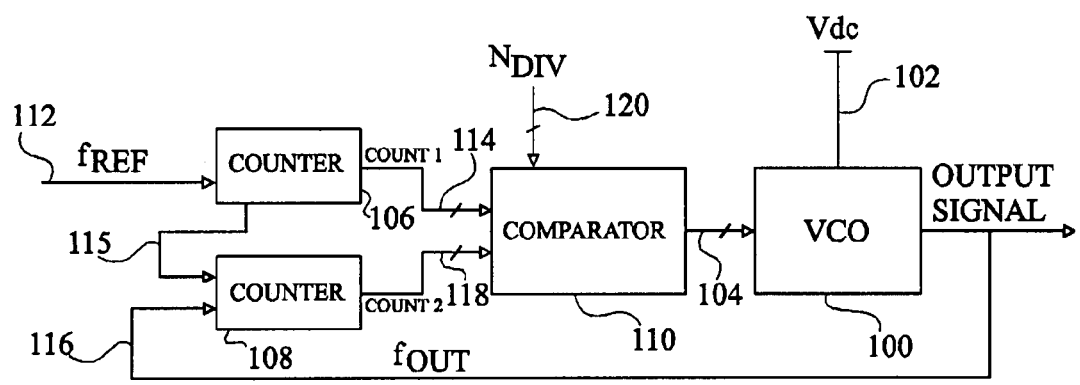
FIG. 4 illustrates an embodiment of a calibration circuit comprising counter circuits according to FIG. 2.

FIG. 4 illustrates a calibration loop for calibrating a voltage controlled oscillator 100. VCO 100 receives an input control voltage $V_{dc}$ on line 102, this voltage controlling the oscillating frequency of the output signal of the VCO. The VCO also comprises a calibration input for receiving calibration signals on lines 104 for calibrating the VCO. VCO 100 comprises a number of switches (not shown in FIG. 4) for selecting the operating range of the VCO, in particular the maximum and minimum frequencies ($f_{max}$ and $f_{min}$) which correspond to maximum and minimum control voltage input levels. Whilst the magnitude of the operating range of the VCO ($f_{max}$-$f_{min}$) remains constant, these switches allow the operating range to be shifted to calibrate the approximate frequency of the VCO output signal for a given input control voltage. The switches are set during a calibration phase such that, for example, the mid-frequency value required corresponds to a mid-voltage level of the supply voltage. The switches are controlled by signals provided at the calibration input on lines 104.

The calibration circuit further comprises first and second counter blocks 106, 108, the output from each being connected to a comparator 110. The first counter block 106 receives a reference frequency signal $f_{REF}$ on line 112. The first counter block 106 counts the rising edges of $f_{REF}$, and provides the output count value 'COUNT 1' on lines 114, this signal controlling states of the comparator 110. The first counter block also provides a timing signal on line 115 to the second counter block 108.

The second counter block 108 is a counter block according to the circuit of FIG. 2 described above, and receives the timing signal from first counter block 106, which provides a reference time period $t_{REF}$ indicated by first and second edges. The reference time period is for example a half period of the signal $f_{REF}$, or more preferably a number of periods of the input frequency signal $f_{REF}$. The second counter block 108 also receives the output $f_{OUT}$ of the VCO 100 on line 116. During the reference time period $t_{REF}$ the second counter block counts the rising or falling edges of the VCO output signal on line 116, and corrects the count value as described in relation to FIG. 2 above, before providing the output count value 'COUNT 2' on lines 118 to the comparator 110.

Comparator 110 is a state machine that operates in one of a number of states determined by the signal 'COUNT 1' received from the first counter block 106. For example, the comparator is programmed to calibrate the VCO for 10 consecutive periods of $f_{REF}$, and then to wait 300 periods before recalibrating. Comparator 110 receives a division ratio signal $N_{DIV}$ on lines 120 in the form of a word (for example 16 bits) indicating the required ratio between the reference frequency signal $f_{REF}$ and the frequency of the output signal of the VCO $f_{OUT}$. During calibration periods of the reference frequency signal $f_{REF}$ the comparator 110 calibrates the switches of the VCO by providing signals on lines 104 such that the signal 'COUNT 2' on lines 118 is as close as possible to the division ratio signal $N_{DIV}$, or to a multiple of n of $N_{DIV}$ in the case that $t_{REF}$ is equal to n half periods of the signal $f_{REF}$. Thus the output frequency signal of the VCO is calibrated such that:

$$f_{OUT} \approx N_{DIV} f_{REF}$$

Once calibration is completed the control signals to the VCO on lines 104 are fixed. A phase locked loop (not shown in FIG. 4) is then used to adjust the voltage level on line 102 until the output frequency $f_{OUT}$ is the required frequency, such that:

$$f_{OUT} \approx N_{DIV} f_{REF}$$

The voltage level on line 102 is thus calibrated to be as close as possible to $V_{dc}$.

Thus the present invention provides a counter circuit that provides a count value with improved precision based on rising and falling edges of an input signal without requiring two counters. This is achieved by counting rising or falling edges of the input signal during a reference time period, and determining whether this value needs to be adjusted by determining the state (high or low) of the input signal at the start time and end time of the reference period. The additional circuitry required to perform the task of determining this state of the input signal occupies much less chip space than the circuitry required by an additional counter. Furthermore, the extra precision of the counter is achieved without increasing the reference time period of the count, and therefore the result from the counter can be provided with no extra delay.

The example of a calibration circuit for a VCO has been provided above, but embodiments of the counter circuit could also be used for other purposes such as to measure the gain of a VCO or as the divider in a digital phase locked loop. The counter circuitry described herein is particularly advantageous in environments in which area is limited, for example in mobile devices. In particular, the counter circuitry is useful in mobile devices for applications such as wireless local access networks (WLAN) and Bluetooth.

Whilst one embodiment of a counter circuit 20 according to the invention has been described in detail with reference to FIG. 2, it will be apparent that there are many variations or alternatives that could be applied to this circuit.

For example, whilst the inverse Q output has be used from the second, third and fourth flip-flops 34, 36, 38, the standard Q output from each of these flip-flops could be used. Furthermore, whilst a NAND gate 56 is used to generate the control signal to the counter 22, in alternative embodiments, different logic could be used.

In alternative embodiments, counter 22 could count the rising edges rather than the falling edges of the input signal, and the signal on lines 52 and 54 could be switched such that they are provided to the '−1' and '+1' inputs of the adder block 26 respectively, to provide the same result.

Furthermore, whilst in the described embodiment the input signal is a symmetrical square-wave, in other words the rising and falling edges are equally spaced apart, in other embodiments, the spacing could be asymmetrical, and could for example have a known ratio between the length of the high and low pulses. In this case, the multiplication of the count value on line 60 and the values added or subtracted from this value could be adjusted accordingly.

Whilst the example of a 13-bit count value at the output 62 of the count circuit has been given above, the count value will be determined by the requirements of the circuit.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Counting circuitry for providing a corrected count value based on the number of rising and falling edges of an input signal occurring during a reference time period, the counting circuitry comprising:
   a counter arranged to provide a first count value based on one of:
   the number of said rising edges of said input signal occurring during said reference time period; and
   the number of said falling edges of said input signal occurring during said reference time period;
   wherein said counting circuitry further comprises adjustment circuitry arranged to generate a corrected count value by determining the state of said input signal at the start time and end time of said reference time period, and adjusting said first count value when the state of said input signal at the start of said reference time period is different from the state of said input signal at the end of said reference time period.

2. The counting circuitry of claim 1, wherein said adjustment circuitry is arranged to add a value to said first count value when said input signal is at a first state at said start time and at a second state at said end time, and to subtract a value when said input signal is at said second state at said start time and at said first state at said end time.

3. The counting circuitry of claim 1 wherein said adjustment circuitry comprises multiplying means arranged to multiply said first count value by two, and adding means arranged to selectively add one and selectively subtract one from the result of said multiplication to generate said corrected count value.

4. The counting circuitry of claim 3, wherein said counter is arranged to count the falling edges of said input signal during said reference time period, and said adjustment circuitry is arranged to add one to the result of said multiplication when said input signal is low at said start time and high at said end time, and minus one from the result of said multiplication when said input signal is high at said start time and low at said end time.

5. The counting circuitry of claim 3, wherein said counter is arranged to count the rising edges of said input signal during said reference time period, and said adjustment means is arranged to add one to the result of said multiplication when said input signal is high at said start time and low at said end time, and minus one from the result of said multiplication when said input signal is low at said start time and high at said end time.

6. The counting circuitry of claim 1, wherein said start and end times of said reference time period are determined by edges of a reference time signal, and said adjustment circuitry comprises:
   first sampling means arranged to sample said reference time signal with falling edges of said input signal and output the result;
   second sampling means arranged to sample said reference time signal with rising edges of said input signal and output the result; and
   third sampling means arranged to sample the output of one of said first and second sampling means with the rising and falling edges of the output of the other one of said first and second sampling means, the generation of said corrected count value being based on the output of said third sampling means.

7. A calibration circuit for calibrating a voltage controlled oscillator, the voltage controlled oscillator generating an output oscillating signal, said calibration circuit comprising:
   counting circuitry according to claim 1, for providing a count value based on the number of rising and falling edges of said output signal of the voltage controlled oscillatory; and
   a comparator for comparing said count value with a reference value and calibrating said voltage controlled oscillator based on said comparison.

8. The calibration circuit of claim 7, wherein said voltage controlled oscillator is calibrated by shifting its operating range.

9. A mobile device comprising counting circuitry for providing a corrected count value based on the number of rising and falling edges of an input signal occurring during a reference time period, the counting circuitry comprising:
- a counter arranged to provide a first count value based on one of:
- the number of said rising edges of said input signal occurring during said reference time period; and
- the number of said falling edges of said input signal occurring during said reference time period;
- wherein said counting circuitry further comprises adjustment circuitry arranged to generate a corrected count value by determining the state of said input signal at the start time and end time of said reference time period, and adjusting said first count value when the state of said input signal at the start of said reference time period is different from the state of said input signal at the end of said reference time period.

10. A method of providing a count value based on the number of rising and falling edges of an input signal occurring during a reference time period, the method comprising:
- providing a first count value based on counting one of:
- the number of said rising edges of said input signal occurring during said reference time period; and
- the number of said falling edges of said input signal occurring during said reference time period;
- determining the state of said input signal at the start time and end time of said reference time period;
- adjusting said first count value when the state of said input signal at the start of said reference time period is different from the state of said input signal at the end of said reference time period to generate a corrected count value; and
- outputting the corrected count value.

* * * * *

UNITED STATES PATENT AND TRADEMARK OFFICE
CERTIFICATE OF CORRECTION

| | |
|---|---|
| PATENT NO. | : 7,466,789 B2 |
| APPLICATION NO. | : 11/724517 |
| DATED | : December 16, 2008 |
| INVENTOR(S) | : Sébastien Rieubon et al. |

It is certified that error appears in the above-identified patent and that said Letters Patent is hereby corrected as shown below:

Title page, item [57] the Abstract should read:

The invention concerns counting circuitry for providing a corrected count value based on the number of rising and falling edges of an input signal occurring during a reference time period, the counting circuitry including a counter arranged to provide a first count value based on one of the number of the rising edges of the input signal occurring during the reference time period, and the number of the falling edges of the input signal occurring during the reference time period; wherein the counting circuitry further includes adjustment circuitry arranged to generate a corrected count value by determining the state of the input signal at the start time and end time of the reference time period, and adjusting the first count value if the state of the input signal at the start of the reference time period is different from the state of the input signal at the end of the reference time period.

Signed and Sealed this

Tenth Day of February, 2009

JOHN DOLL
*Acting Director of the United States Patent and Trademark Office*